United States Patent
Yasutake et al.

(10) Patent No.: US 7,170,137 B2
(45) Date of Patent: Jan. 30, 2007

(54) SEMICONDUCTOR DEVICE AND METHOD OF MANUFACTURING THE SAME

(75) Inventors: Hitomi Yasutake, Yokohama (JP); Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 70 days.

(21) Appl. No.: 10/988,597

(22) Filed: Nov. 16, 2004

(65) Prior Publication Data

US 2005/0280062 A1  Dec. 22, 2005

(30) Foreign Application Priority Data

Jun. 17, 2004  (JP)  ............ 2004-179652

(51) Int. Cl.
- *H01L 29/76* (2006.01)
- *H01L 29/94* (2006.01)
- *H01L 31/062* (2006.01)
- *H01L 31/113* (2006.01)
- *H01L 31/119* (2006.01)

(52) U.S. Cl. ............ 257/365; 257/202; 257/316; 257/317; 257/318; 257/319; 257/366; 257/401

(58) Field of Classification Search ........ 257/316–319, 257/202, 401, 365–366
See application file for complete search history.

(56) References Cited

U.S. PATENT DOCUMENTS

| | | | | |
|---|---|---|---|---|
| 4,714,519 A | * | 12/1987 | Pfiester | 438/304 |
| 5,716,861 A | * | 2/1998 | Moslehi | 438/231 |
| 6,064,088 A | * | 5/2000 | D'Anna | 257/341 |
| 6,424,016 B1 | | 7/2002 | Houston | 257/407 |
| 6,630,720 B1 | * | 10/2003 | Maszara et al. | 257/407 |
| 7,006,378 B1 | * | 2/2006 | Saito et al. | 365/185.05 |
| 2001/0013600 A1 | * | 8/2001 | Cunningham | 257/1 |
| 2002/0197810 A1 | * | 12/2002 | Hanafi et al. | 438/330 |
| 2004/0207007 A1 | * | 10/2004 | Lin et al. | 257/316 |
| 2005/0111279 A1 | * | 5/2005 | Ogura et al. | 365/222 |

FOREIGN PATENT DOCUMENTS

| | | |
|---|---|---|
| JP | 57-148375 | 9/1982 |
| JP | 3-270172 | 12/1991 |
| JP | 4-96275 | 3/1992 |
| JP | 6-5850 | 1/1994 |
| JP | 7-78975 | 3/1995 |
| JP | 7-2212191 | 8/1995 |
| JP | 10-4189 | 1/1998 |

OTHER PUBLICATIONS

Hiroshi Kujirai, et al. "Data Retention Time in DRAM with WSix/ P+ poly-Si Gate NMOS Cell Transistors", 2001 IEEE, pp. 18.2-18.2.4.

* cited by examiner

*Primary Examiner*—Ida M. Soward
(74) *Attorney, Agent, or Firm*—Oblon, Spivak, McClelland, Maier & Neustadt, P.C.

(57) ABSTRACT

A semiconductor device includes a semiconductor substrate having a first conductivity type. A pair of source/drain areas having a second conductivity type is formed on a surface of the semiconductor substrate. A gate insulating film is provided on a channel area between the source/drain areas. A gate electrode having the first conductivity type is provided on the gate insulating film. The gate electrode has a first portion located above a channel area and second portions located above the source/drain area. The concentration of majority carriers in the second portion is lower than that in the first portion.

10 Claims, 3 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2004-179652, filed Jun. 17, 2004, the entire contents of which are incorporated herein by reference.

BACKGROUND OF THE INVENTION

1. Field of the Invention

The present invention relates to a semiconductor device and a method of manufacturing the semiconductor device, and to, for example, a metal oxide semiconductor field effect transistor (MOSFET).

2. Description of the Related Art

A factor that determines the threshold voltage for a MOSFET is the concentration of impurities in the area (hereinafter referred to as a channel area) between source/drain areas. In general, the threshold voltage increases as the concentration of impurities increases. It is known that the off leakage current can be reduced by increasing the threshold voltage.

However, an increase in the concentration of impurities in the channel area may increase the leakage current among the source/drain area and the gate electrode and the semiconductor substrate, more specifically, between the source/drain area and the channel area. If a MOSFET with a large leakage current from this part is used in each memory cell of, for example, a DRAM (Dynamic Random Access Memory), the pause characteristic (refresh characteristic) of the memory cell may be degraded. That is, the time for which the memory cell can hold data may decrease. Thus, there is a tradeoff between the off leakage current and the leakage current flowing between the source/drain area and the channel area.

BRIEF SUMMARY OF THE INVENTION

According to a first aspect of the invention, there is provided a semiconductor device comprising: a semiconductor substrate having a first conductivity type; a pair of source/drain areas formed in a surface of the semiconductor substrate and having a second conductivity type; a gate insulating film provided on a channel area between the source/drain areas; and a gate electrode provided on the gate insulating film, having the first conductivity type, and having a first portion located above the channel area and second portion located above the source/drain area, the concentration of majority carriers in the second portion being lower than that in the first portion.

According to a second aspect of the invention, there is provided a semiconductor device comprising: a semiconductor substrate having a first conductivity type; a pair of source/drain areas formed in a surface of the semiconductor substrate and having a second conductivity type; a gate insulating film provided on a channel area between the source/drain areas; and a gate electrode provided on the gate insulating film, the gate electrode having a first portion and a second portion, the first portion being located above the channel area and having the first conductivity type, the second portion being located above the source/drain area and having the second conductivity type.

According to a third aspect of the invention, there is provided a method of manufacturing a semiconductor device, the method comprising: forming a gate electrode having a first conductivity type on a gate insulating film on a semiconductor substrate having the first conductivity type; lowering a concentration of majority carriers in a second portion located at an end of the gate electrode than that in a first portion located at a center of the gate electrode; and forming a pair of source/drain areas having the second conductivity type, the source/drain areas sandwiching a channel area of a surface of the semiconductor substrate which is located below the gate electrode, a part of the source/drain area being located below the second portion of the gate electrode.

According to a fourth aspect of the invention, there is provided a method of manufacturing a semiconductor device, the method comprising: forming a first portion of a gate electrode having a first conductivity type, on a gate insulating film on a semiconductor substrate having the first conductivity type; forming a second portion of the gate electrode having a second conductivity type on a side of the first portion of the gate electrode; and forming a pair of source/drain areas having the second conductivity type, the source/drain areas sandwiching a channel area of a surface of the semiconductor substrate which is located below the gate electrode, a part of the source/drain area being located below the second portion of the gate electrode.

DETAILED DESCRIPTION OF THE INVENTION

Figure 1:
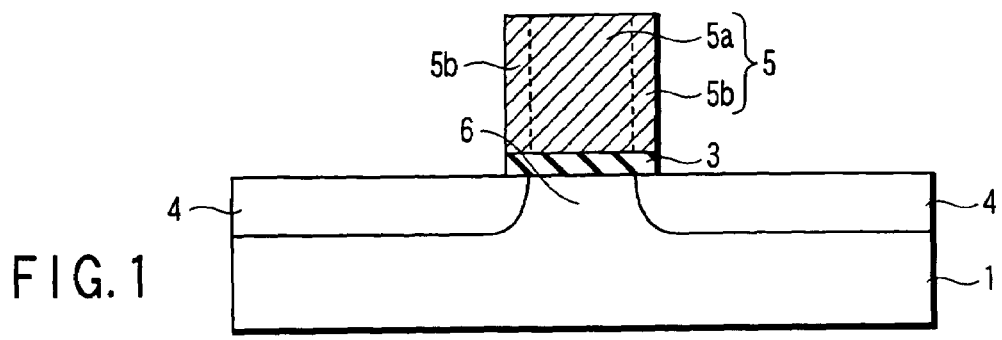
FIG. 1 is a sectional view schematically showing a semiconductor device according to a first embodiment of the present invention.

While developing the present invention, the inventors studied methods of realizing a semiconductor device with a reduced leakage current. As a result, the inventors have obtained the knowledge described below.

First, in general, the conductivity type of a channel area of a MOSFET is different from that of the gate electrode of the MOSFET. In contrast, a MOSFET is known in which the channel area and the gate electrode have the same conductivity type in order to avoid the above described tradeoff. This enables a high threshold voltage to be set even if the concentration of impurities in the channel area is low to decrease the off leakage current. Furthermore, since the concentration of impurities in the channel area is low, a possible leakage current from between the source/drain area and the channel area can be suppressed. Consequently, the pause characteristic of memory cells can be improved.

However, with a MOSFET in which the channel area and the gate electrode have the same conductivity type, the problem described below may occur. If an edge of each n-type source/drain area which is closer to the channel area is located below a p-type gate electrode, the gate electrode reduces the energy band gap in the junction between the source/drain area and the channel area. Accordingly, a large leakage current which is called a gate induced leakage current (GIDL) is generated and passes through the junction. This may degrade the characteristics of the MOSFET.

With reference to the drawings, description will be given below of embodiments of the present invention configured on the basis of this knowledge. In the following description, components having substantially the same functions and configurations are denoted by the same reference numerals. Duplicate descriptions will be given only as required.

(First Embodiment)

FIG. 1 is a sectional view schematically showing a semiconductor device according to a first embodiment of the present invention. In the description below, an n-channel MOSFET will be taken by way of example. As shown in FIG. 1, a transistor 2 is formed on a semiconductor substrate 1 substantially composed of, for example, p-type silicon. The transistor 2 has a gate insulating film 3, n-type source/drain areas 4, and a p-type gate electrode 5. The gate insulating film 3 is provided on the semiconductor substrate 1 and on a channel area 6 between source/drain areas 4. A gate electrode 5 is provided on the gate insulating film 3. The gate electrode 5 extends from the top of the gate insulating film 3 to the top of the source/drain areas 4.

Donor impurities such as phosphorous or arsenic are present in the source/drain areas 4 in order to make these areas 4 n type. The concentration of the donor impurities, typically, the concentration of phosphorous or arsenic, is, for example, about $1 \times 10^{16}$ to $5 \times 10^{18}$ cm$^{-3}$.

The gate electrode 5 is substantially composed of, for example, polysilicon and is made p type by injecting acceptor impurities (first impurities) such as boron into the electrode 5. The gate electrode 5 has a first portion 5a on the gate insulating film 3 and second portions 5b located at respective ends of the gate electrode 5 in a direction along a surface of the semiconductor substrate 1.

The boundary between the first portion 5a and each second portion 5b is located almost at the same position as an extension of an edge of the corresponding source/drain area 4 which faces the channel. The concentration of majority carriers in the second portions 5b, that is, the concentration (number) of holes, is lower than that in the first portion 5a. This is accomplished by, for example, setting the concentration of the acceptor impurities in the first portion 5a to be the same as that in the second portions 5b and injecting donor impurities (second impurities) required to form an n-type semiconductor, for example, phosphorous or arsenic, into the second portions 5b. Thus, electrons provided by the donor impurities are bound to holes provided by the acceptor impurities to reduce the concentration of the holes, the majority carriers in the second portion 5b. Consequently, the concentration of the donor impurities in the second portions 5b is higher than that in the first portion 5a. The concentration of the donor impurities in the first portion 5a is typically zero.

More strictly speaking, the concentration of the acceptor impurities in the first portion 5a is substantially the same as that in the second portions 5b. Here, the word "substantially" means that the first portion 5a and the second portions 5b are derived from the same film formed in one step. The word "substantially" thus means that the concentration of the acceptor impurities in the first portion 5a is the same as that in the second portions 5b to the degree that the concentrations include a variation in processing results which may occur during one process.

The concentrations of the impurities are determined so that the concentration of the majority carriers in the channel area of the semiconductor substrate 1 and the concentration of the majority carriers in the first portion 5a of the gate electrode have values conforming to the desired characteristics of the MOSFET including these portions. Characteristics taken into account in this case include, for example, a threshold voltage and an off leakage current. With these characteristics taken into account, the average concentration of the acceptor impurities in the channel area 6 is, for example, about $1 \times 10^{17}$ to $1 \times 10^{18}$ cm$^{-3}$. The average concentration of the acceptor impurities in the gate electrode 5 is, for example, about $1 \times 10^{20}$ cm$^{-3}$ or less.

To suppress a decrease in energy band gap in the junction between each source/drain area 4 and the channel area 6, which decrease is attributed to the majority carriers in the second portions 5b of the p-type gate electrode 5, it is desirable that the concentration of the majority carriers in the second portion 5b is low. Since the concentration of the acceptor impurities in the second portions 5b is the same as that in the first portion 5a, the number of majority carriers in the second portions 5b is set to a desired value by adjusting the concentration of the donor impurities in the second portions 5b. Thus, typically, the concentration of the donor impurities in the second portions 5b is almost the same as that of, for example, the acceptor impurities in the first portion 5a (about 99.9 to 99.99% of the concentration of the acceptor impurities in the first portion) and is about $1 \times 10^{16}$ to $1 \times 10^{17}$ cm$^{-3}$.

Figure 2:
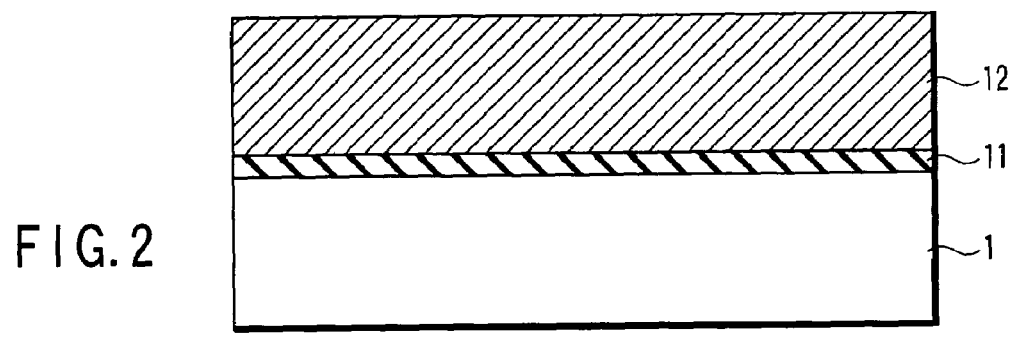
FIG. 2 is a sectional view showing a part of a process of manufacturing a semiconductor device according to the first embodiment.

Now, with reference to FIGS. 2 to 5, description will be given of a method of manufacturing the semiconductor device in FIG. 1. FIGS. 2 to 5 are sectional views sequentially showing a part of a process of manufacturing the semiconductor device in FIG. 1. As shown in FIG. 2, after ions are injected into the channel area 6 in order to control the concentration of the impurities in the channel area 6, a material film 11 for the gate insulating film 3 is formed all over the surface of the semiconductor substrate 1 by, for example, a thermal oxidation process. Then, a material film 12 for the gate electrode 5 is formed on the gate insulating film 3. In this case, for example, polysilicon into which no impurities have been injected is deposited by, for example, a chemical vapor deposition (CVD) process. Then, ions are injected into the polysilicon through the entire surface; the dose and energy of the ions are controlled so that the concentration of the acceptor impurities in the polysilicon is the same as the required concentration of the acceptor impurities in the first portion 5a of the gate electrode.

Figure 3:
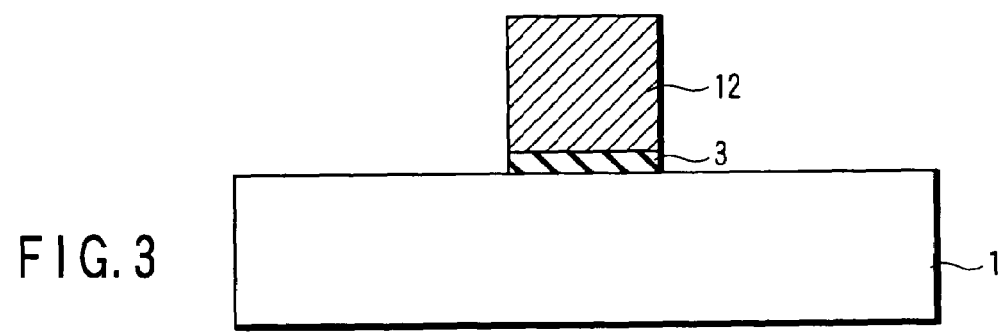
FIG. 3 is a sectional view showing a step succeeding the one shown in FIG. 2.

Then, as shown in FIG. 3, the material films 11 and 12 are patterned by a lithography process and anisotropic etching such as an reactive ion etching (RIE) process. Specifically, a mask material (not shown) is deposited on the material film 12 for the gate electrode 5. The mask material is then etched by the RIE process or the like so as to remain only in an area in which the gate electrode 5 is to be formed. Then, the etched mask material is used as a mask to etch the material film 12 by the RIE process or the like. Then, the mask material is removed. As a result, the gate insulating film 3 is formed and the material film 12 is shaped into the gate electrode 5.

Figure 4:
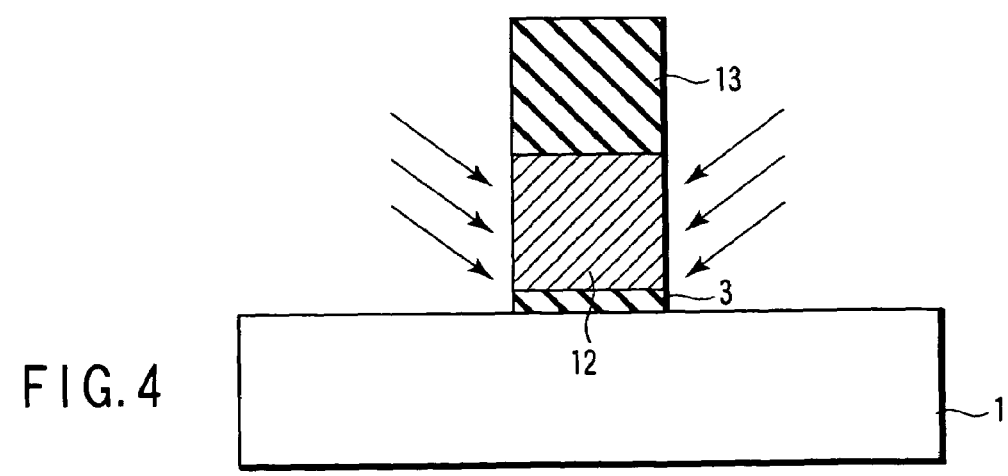
FIG. 4 is a sectional view showing a step succeeding the one shown in FIG. 3.
Figure 5:
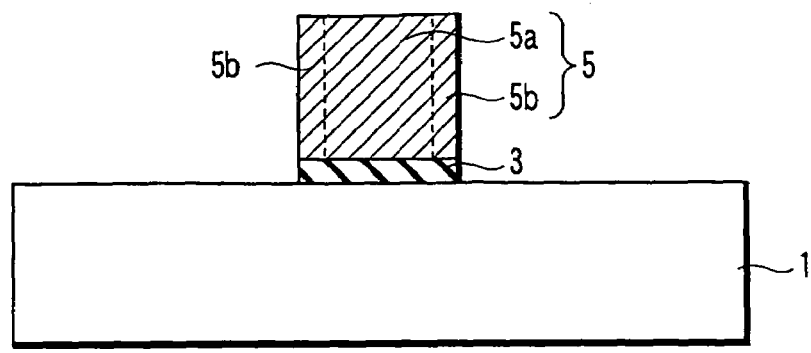
FIG. 5 is a sectional view showing a step succeeding the one shown in FIG. 4.

Then, as shown in FIG. 4, a mask material 13 is formed on the gate electrode by the lithography process and the anisotropic etching such as the RIE process. The mask material 13 may be the same as that used to pattern the gate electrode 5. Then, as ions, donor impurities such as phosphorous or arsenic are injected through side walls of the gate electrode 5. The injection conditions are controlled so that the second portions 5b of the gate electrode 5 have the above donor impurity concentration. Subsequently, the mask material 13 is removed. As a result, as shown in FIG. 5, the first portion 5a and second portions 5b of the gate electrode 5 are formed.

Figure 6:
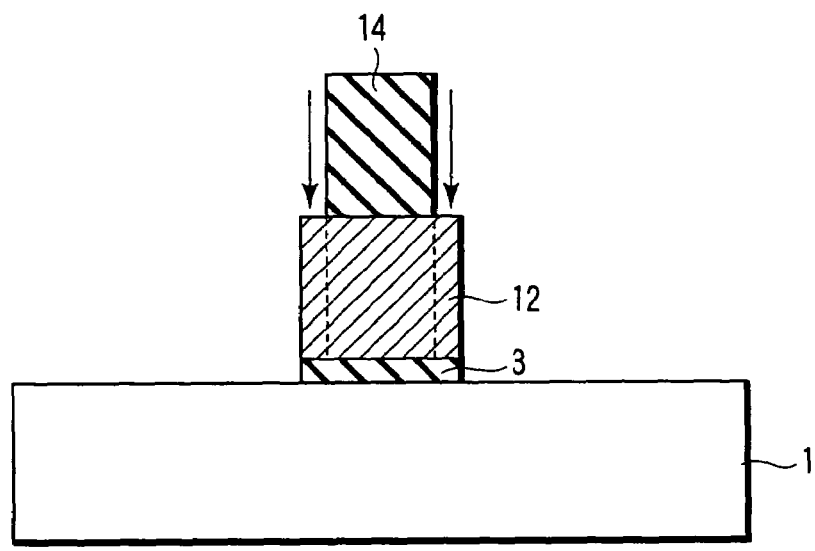
FIG. 6 is a sectional view showing another example of the step succeeding the one shown in FIG. 3.

The steps from FIGS. 3 to 5 may also be executed as described below. FIG. 6 is a sectional view showing another example of the step succeeding the one shown in the FIG. 3. First, as shown in FIG. 6, a mask material 14 is formed, by the lithography process and the anisotropic etching such as the RIE process, on an area of the gate structure 13 in which the first portion 5a is to be formed. Then, the mask material 14 is used as a mask to inject donor impurities into the gate structure 13 from above. Subsequently, the mask material 14 is removed. As a result, as shown in FIG. 5, the first portion 5a and second portions 2b of the gate electrode 5 are formed.

Then, as shown in FIG. 1, a known method is executed to form the source/drain areas 4 using, for example, the lithography process and ion injection. Subsequently, side walls (not shown) of the gate may be formed as desired.

With the semiconductor device according to the first embodiment of the present invention, the gate electrode 5 has the same conductivity type as that of the channel. The concentration of the majority carriers in the second portions 5b of the gate electrode 5, located above the source/drain areas 4, is lower than that in the first portion 5a, located above the channel area 6. Consequently, it is possible to reduce the leakage current flowing between source/drain areas and the channel area as well as the off leakage current as described above. Further, the concentration of the majority carriers in the second portions 5b of the gate electrode 5, located above the source/drain areas 4, is lower than that in the first portion 5a. Consequently, it is possible to maintain a high energy band gap in the junction between each source/drain area 4 and the channel area 6. Therefore, the leakage current flowing via the junction can be reduced to realize a high-performance MOSFET. In particular, if the MOSFET according to the present embodiment is used in each memory cell of a DRAM, the pause characteristic of the memory cell can be improved.

(Second Embodiment)

In the first embodiment, the concentration of the majority carriers in the second portions 5b of the gate electrode 5 is reduced below that in the first portion 5a to suppress a decrease in energy band gap in the junction between each source/drain area 4 and the channel area 6. In contrast, in a second embodiment, the first portion 5a has the same conductivity type as that of the channel. The second portions 5b have a conductivity type opposite to that of the channel area.

Figure 7:
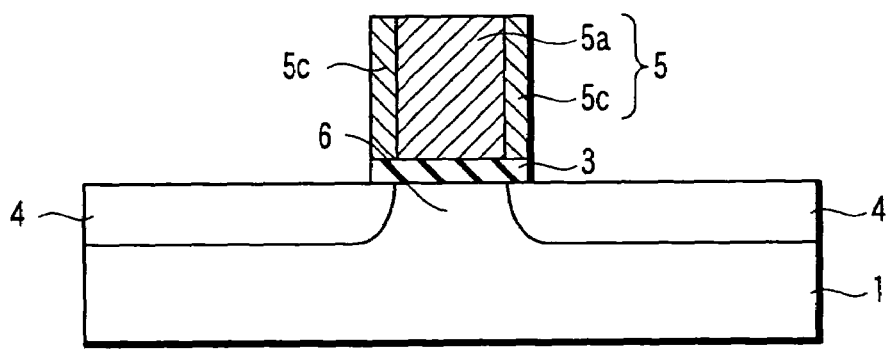
FIG. 7 is a sectional view schematically showing a semiconductor device according to a second embodiment of the present invention.

FIG. 7 is a sectional view schematically showing a semiconductor device according to a second embodiment of the present invention. As shown in FIG. 7, the gate electrode 5 is composed of a first portion 5a and second portions 5c. The second portions 5c have a conductivity type opposite to that of the first portion 5a, that is, in this case, n type. Donor impurities such as phosphorous or arsenic are introduced into the second portions 5c. The concentration of the donor impurities is, for example, about $1 \times 10^{17}$ to $1 \times 10^{20}$ cm$^{-3}$. The configuration of the remaining parts is the same as that of the first embodiment.

Figure 8:
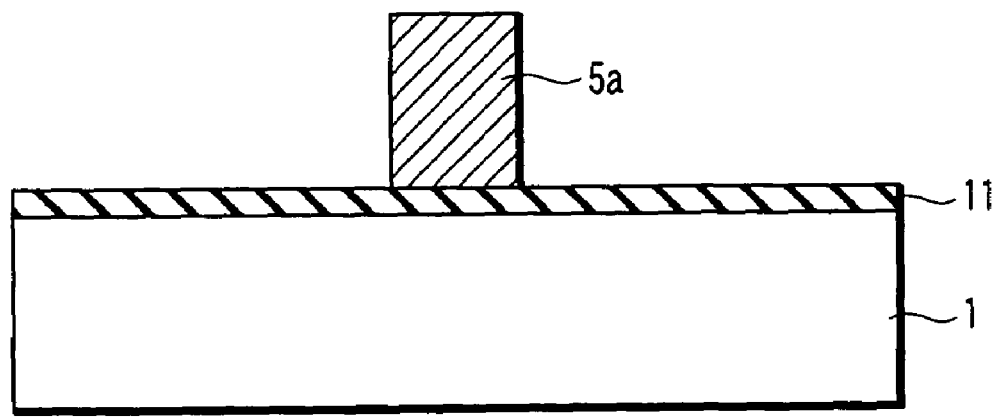
FIG. 8 is a sectional view showing a part of a process of manufacturing a semiconductor device according to the second embodiment.

Now, with reference to FIGS. 8 and 9, description will be given of a method of manufacturing the semiconductor device in FIG. 7. First, the same step as that shown in FIG. 2 for the first embodiment is executed. Then, the first portion 5a of the gate electrode 5 is formed by using the lithography process and the anisotropic etching such as the RIE process to pattern the material film 12 for the gate electrode 5 as shown in FIG. 8.

Figure 9:
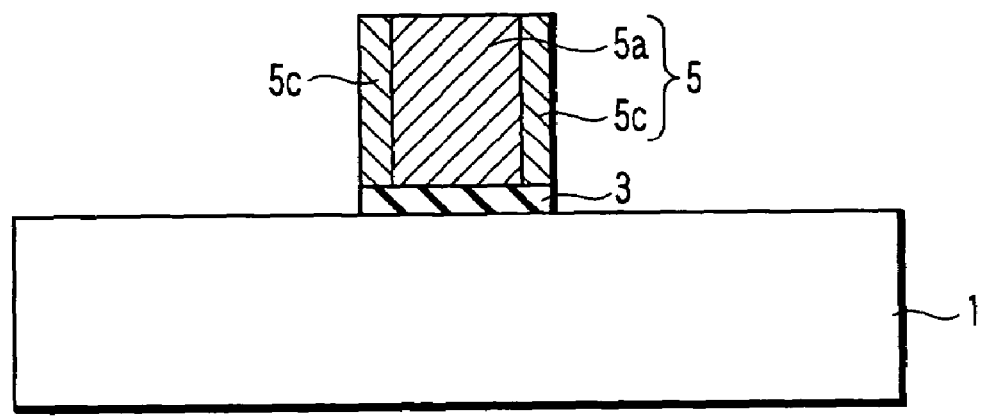
FIG. 9 is a sectional view showing a step succeeding the one shown in FIG. 8.

Then, the second portions 5c are formed by depositing polysilicon on side walls of the first portion 5a in a phosphorous or arsenic atmosphere as shown in FIG. 9. Then, the gate insulating film 3 is formed by etching the material film 11 using the gate electrode 5 as a mask.

Then, as shown in FIG. 7, the source/drain areas 4, side wall insulating films (not shown), and the like are formed as in the case of the first embodiment.

With the semiconductor device according to the second embodiment of the present invention, the gate electrode 5 has the first portion 5a, located above the channel area 6 and having the same conductivity type as that of the channel, and the second portions 5c, located above respective source/drain areas 4 and having the same conductivity type as that of the channel. The first portion 5a, facing the channel area 6 has the same conductivity type as that of the channel. Consequently, it is possible to reduce the leakage current flowing between source/drain areas 4 and the channel area 6 as well as the off leakage current as described above. Further, the second portions 5c, facing the respective source/drain areas 4 have the same conductivity type as that of the source/drain areas 4. Consequently, it is possible to maintain a high energy band gap in the junction between source/drain areas 4 and the channel area 6. Therefore, the leakage current flowing via the junction can be reduced to realize a high-performance MOSFET.

When the MOSFET according to the first or second embodiment is used to construct a memory cell of a DRAM, cell capacitors may be of any type including a stack type or a trench type.

In the description of the first and second embodiments, an n-channel-type MOSFET is taken by way of example. However, the present invention is not limited to this aspect. Each embodiment can be applied to a p-channel-type MOSFET. In this case, the application can be easily accomplished by reversing the conductivity type and changing the type of impurities in accordance with the reversed conductivity type, in the above description.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate having a first conductivity type;

a pair of source/drain areas formed in a surface of the semiconductor substrate and having a second conductivity type;

a gate insulating film provided on a channel area between the source/drain areas; and a gate electrode provided on the gate insulating film, having the first conductivity type, and having a first portion located above the channel area and a second portion located above the source/drain area, the concentration of majority carriers in the second portion being lower than that in the first portion.

2. The device according to claim 1, wherein a boundary between the first portion and the second portion is formed substantially on an imaginary extension line of an edge of the source/drain area at a channel area side.

3. The device according to claim 1, wherein the gate electrode contains first impurities including atoms which generate carriers of the first conductivity type in a semiconductor material substantially constituting the gate electrode, the second portion contains second impurities including atoms which generate carriers of the second conductivity type in the semiconductor material, and the concentration of the second impurities in the second portion is higher than that in the first portion.

4. The device according to claim 3, wherein the concentration of the first impurities in the first portion is substantially the same as that in the second portions.

5. The device according to claim 3, wherein the gate electrode is substantially composed of polysilicon, the first impurities are substantially composed of boron, and the second impurities are substantially composed of phosphorous or arsenic.

6. A semiconductor device comprising:

a semiconductor substrate having a first conductivity type;

a pair of source/drain areas formed in a surface of the semiconductor substrate and having a second conductivity type;

a gate insulating film provided on a channel area between the source/drain areas; and a gate electrode provided on the gate insulating film and having a first portion and a second portion, the first portion having the first conductivity type and being located above the channel area, the second portion having the first conductivity type and being located above the source/drain area, the concentration of majority carriers in the second portion being lower than that in the first portion.

7. The device according to claim 6, wherein a boundary between the first portion and the second portion is formed substantially on an imaginary extension line of an edge of the source/drain area at a channel area side.

8. The device according to claim 6, wherein the gate electrode contains first impurities including atoms which generate carriers of the first conductivity type in a semiconductor material substantially constituting the gate electrode, the second portion contains second impurities including atoms which generate carriers of the second conductivity type in the semiconductor material, and the concentration of the second impurities in the second portion is higher than that in the first portion.

9. The device according to claim 8, wherein the concentration of the first impurities in the first portion is substantially the same as that in the second portions.

10. The device according to claim 8, wherein the gate electrode is substantially composed of polysilicon, the first impurities are substantially composed of boron, and the second impurities are substantially composed of phosphorous or arsenic.

* * * * *